United States Patent [19]

Patrick

[11] Patent Number: 4,847,990
[45] Date of Patent: Jul. 18, 1989.

[54] VIBRATING COMPONENT INSERTION TOOL

[76] Inventor: George D. Patrick, P.O. Box 23054, San Diego, Calif. 92123

[21] Appl. No.: 88,718

[22] Filed: Aug. 24, 1987

[51] Int. Cl.⁴ .............................................. H05K 13/04
[52] U.S. Cl. ........................................ 29/741; 29/758; 29/837
[58] Field of Search ........................... 29/741, 758, 837

[56] References Cited

U.S. PATENT DOCUMENTS

| | | | |
|---|---|---|---|
| 4,030,180 | 6/1977 | Pierson | 29/741 |
| 4,610,084 | 9/1986 | Anderson et al. | 29/834 |
| 4,627,161 | 12/1986 | Cushman | 29/741 X |

*Primary Examiner*—Howard N. Goldberg
*Assistant Examiner*—Taylor J. Ross
*Attorney, Agent, or Firm*—James D. Hall; Thomas J. Dodd; Todd A. Dawson

[57] ABSTRACT

A component insertion tool having an electric motor which is connected to a drive shaft having an orbitally vibrating head. The component is placed in the head and positioned over the correct location on a printed circuit board. The tool is turned on and the head orbitally moves the component slightly as the component and tool are pressed toward the circuit board to insert the component properly in the board. A spring allows the head to retract while the component is pressed into contract with the board.

6 Claims, 5 Drawing Sheets

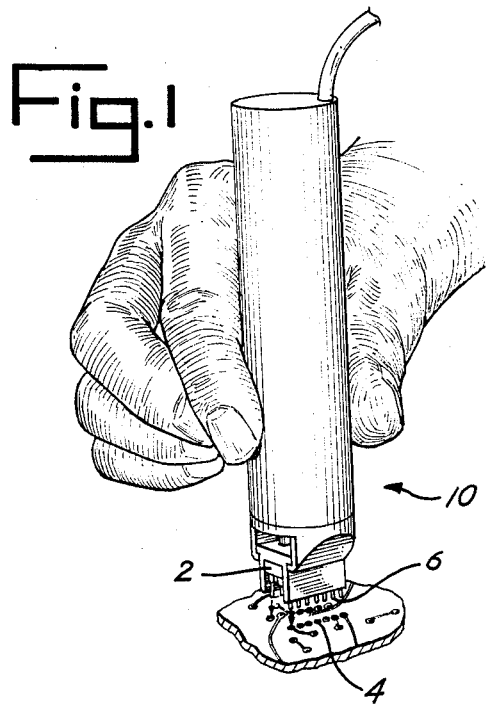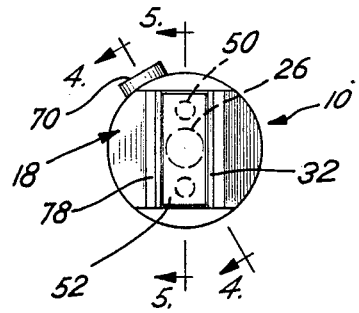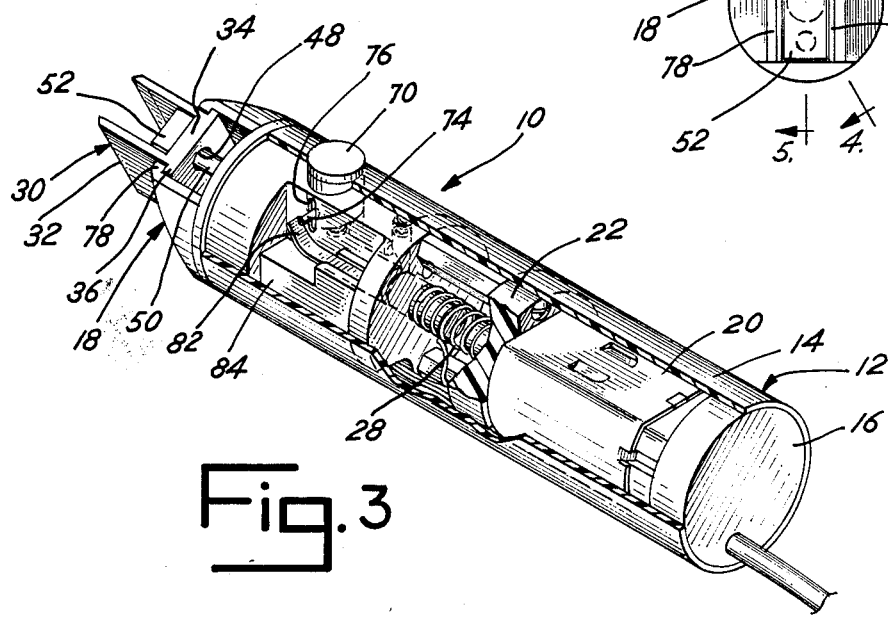

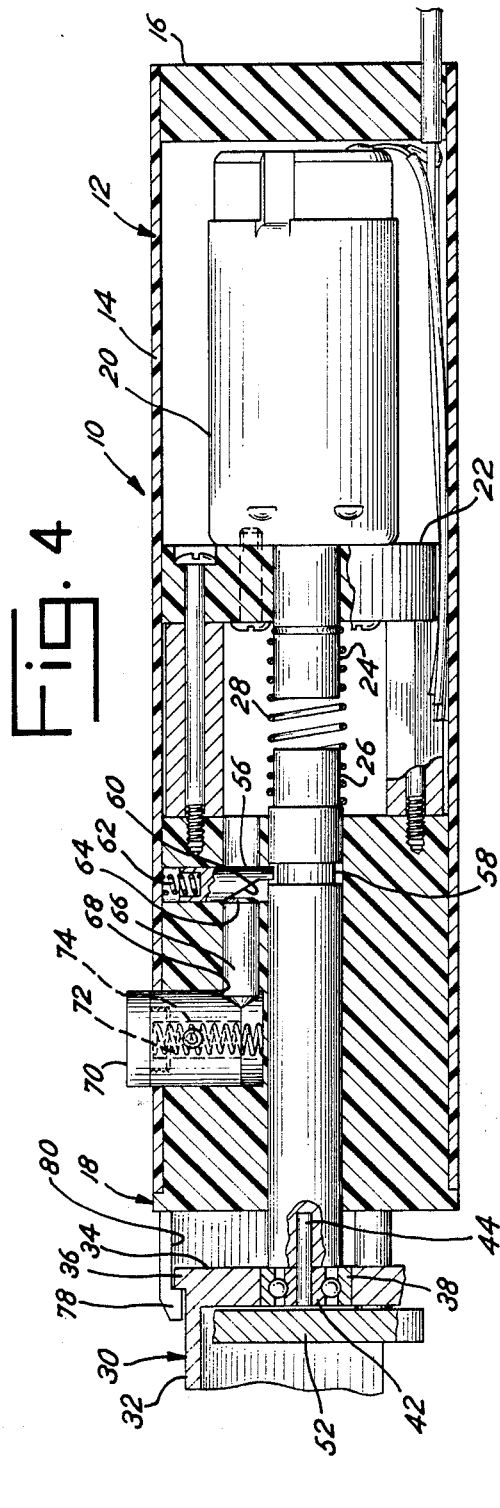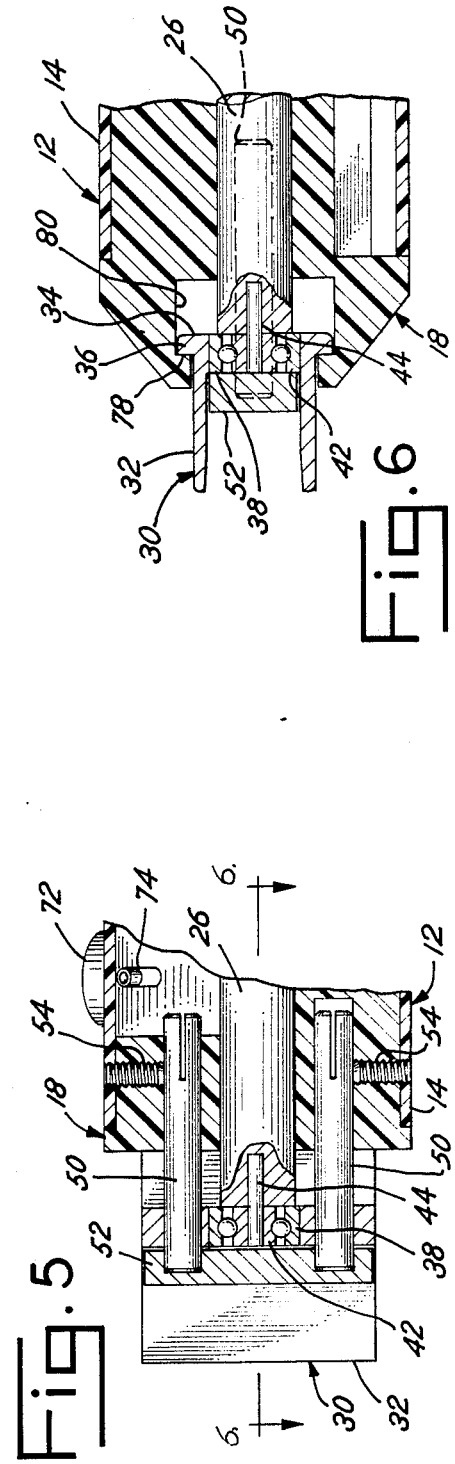

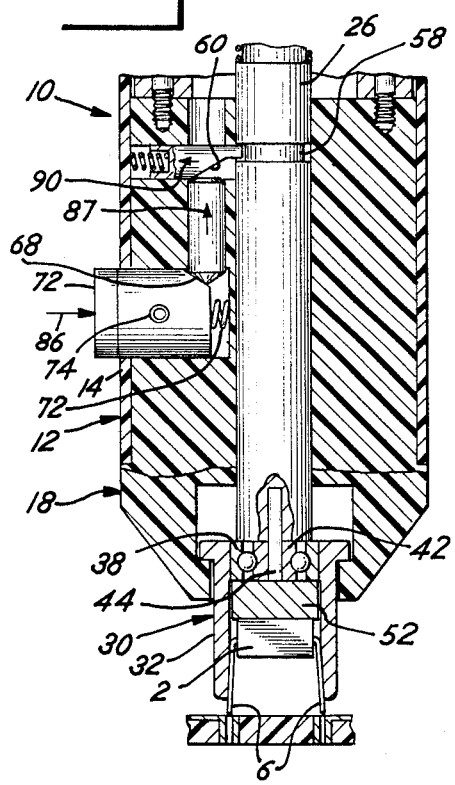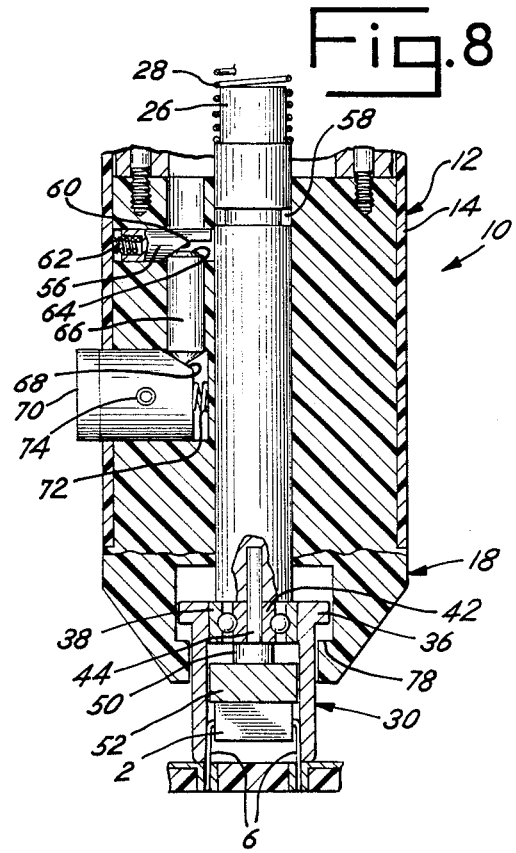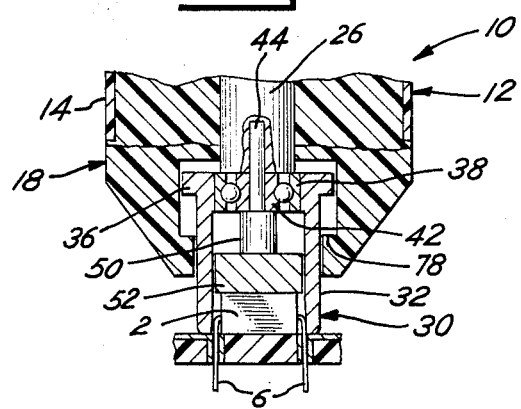

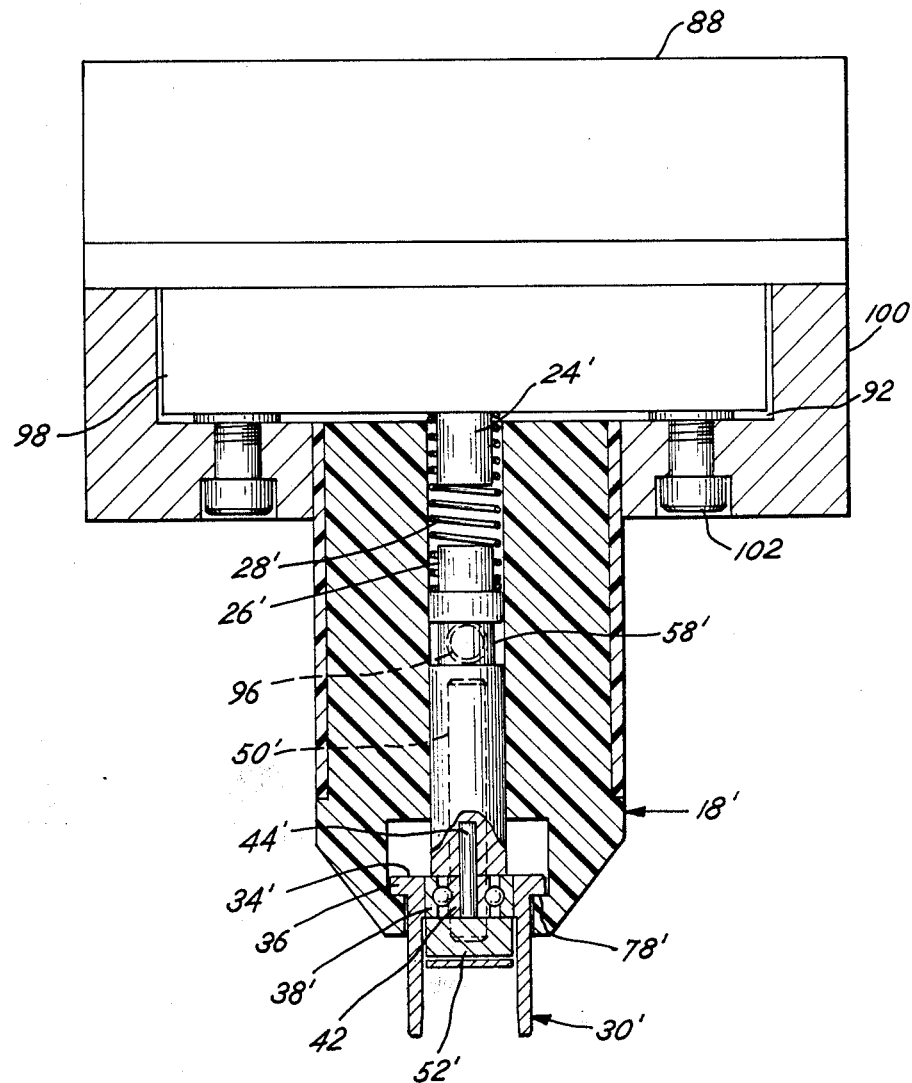

VIBRATING COMPONENT INSERTION TOOL

BACKGROUND OF THE INVENTION

This invention relates to a component insertion tool and will have special but not limited application to a tool for inserting the leads of integrated circuits into accommodating holes in circuit boards.

Heretofore, integrated circuits have been inserted into a printed circuit board by either a type of computerized "pick and place" machine or by hand. A problem typically associated with "pick and place" machines is caused by the integrated circuit leads being sometimes slightly bent out of position. In a "pick and place" type machine a slightly bent lead will prevent the part from being inserted properly and therefore the unit to which the part belonged will be rejected. Hand insertion creates many different problems, not the least of which is the length of time it takes to straighten and then insert the leads. Such effort is contrary to the concept of mass production and assembly line efficiency. In addition, however, certain components are subject to contamination and to possible static damage, which can be caused by a worker touching the component. These components are at such size that it is impractical for the worker to wear any kind of gloves. Accordingly, the time involved to meticulously insure proper positioning and insertion by hand makes such a method much worse than merely impractical.

In practice, it is found that the multiplicity of leads on, for example, an integrated circuit, may be out of perpendicular by a matter of only a degree or two, an amount not discernable to the eye. Quite obviously, because of quality control, any deflection or bending beyond that amount will cause a rejection of the component. Therefore, the problem is with those leads which are only slightly bent out of alignment.

When such components are assembled through current state-of-the-art equipment, as mentioned previously, it is at that time that a slightly bent lead will catch on the edge of a mating hole and cause a problem. In this invention, the integrated circuit and leads are vibrated during assembly to aid in the insertion of the leads, even when slightly bent, into the circuit board holes.

SUMMARY OF THE INVENTION

For purposes of illustration and description, the principal embodiment herein depicted and described is hand-held and connectable via wire and plug to a common electrical source. It will be obvious that the tool may be battery driven if for use, as an example, by a repair technician who transports it in a tool chest.

Further, it will be understood that the tool is amenable to use in robotic automatic insertion or by machines on assembly lines. In these applications, a multiplicity of tools may be utilized on a jig or automated machine. The principles involved in the operation of the tool, or a multiplicity of tools, remain essentially the same.

When used with robotic or similar assembly machines, the invention will be combined with any number of related mechanisms and control initiators, such as laser beams, bench marks, etc., and will be operated by computer or other means which do not form a part of this invention. The point being that this tool is of unlimited versatility which lends itself to applications which remain within the scope of the tool itself. This invention has practical use in a variety of situations in industry whether on an assembly line in combination with robotic arms or in a repair shop used by a technician. The insertion tool utilizes a retractable head which is orbitally moving relative to a circuit board and which holds an integrated circuit chip for insertion. Once the chip leads are fitted into the circuit board holes, the insertion tool head releases the chip as the chip is seated upon the board. The orbital motion of the tool head and integrated circuit chip causes flexure of the chip leads as they are inserted into the board holes which compensates for bent or out of positioned leads. Additionally, the tool of this invention could have application in the insertion of screws and other items into accommodating openings.

Accordingly, it is an object of this invention to provide a novel component insertion tool.

Another object of this invention is to provide for a component insertion tool with a orbitally moving component retainer.

Another object of this invention is to provide for an insertion tool with a retractable component retainer.

Another object of this invention is to provide for a tool used to insert integrated circuits into circuits boards.

Other objects of this invention will become apparent upon a reading of the following description.

BRIEF DESCRIPTION OF THE DRAWINGS

A preferred embodiment of the invention has been depicted for purposes of illustration wherein:

FIG. 1 is a perspective view of the tool holding an integrated circuit (IC) positioned for insertion in a printed circuit board.

FIG. 2 is a lower end view of the insertion tool with the IC removed, and in which the angular relationship between the plunger and orbital head is indicated.

FIG. 3 is a perspective view of the insertion tool with portions cut away for illustrative purposes.

FIG. 4 is an enlarged fragmentary longitudinal sectional view of the insertion tool taken along line 4—4 of FIG. 2.

FIG. 5 is a fragmentary longitudinal sectional view of the insertion tool at its lower end taken along line 5—5 of FIG. 2.

FIG. 6 is a fragmentary sectional view of the insertion tool taken along line 6—6 of FIG. 5.

FIG. 7 is a fragmentary sectional view of the insertion tool shown carrying the IC with its actuator button being depressed to start the orbital action prior to IC insertion.

FIG. 8 is a fragmentary sectional view of the insertion tool showing in sequence insertion of the IC.

FIG. 9 is a fragmentary sectional view of the insertion tool showing in sequence the fully inserted IC.

FIG. 11 is a fragmentary sectional view of the insertion tool taken along line 11—11 of FIG. 10.

DESCRIPTION OF THE PREFERRED EMBODIMENTS

Figure 10:
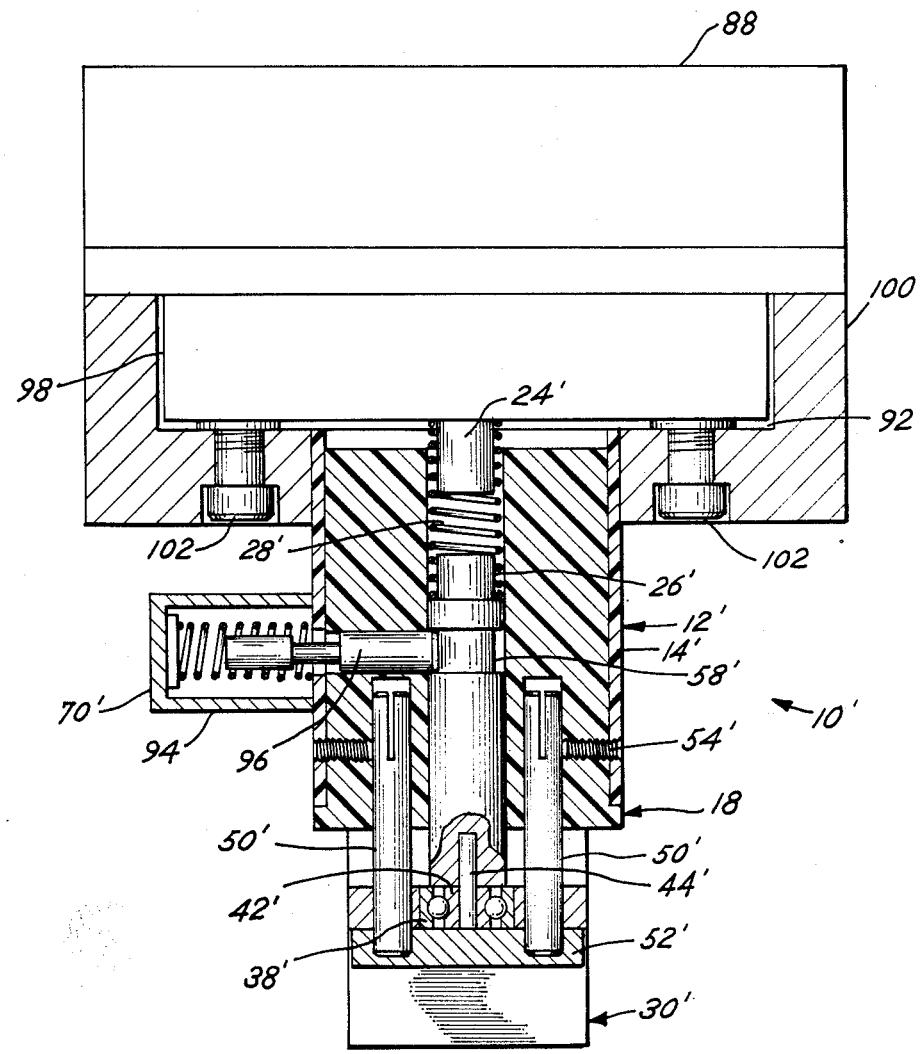
FIG. 10 is an enlarged fragmentary longitudinal sectional view of the insertion tool positioned on a robotic apparatus.

The preferred embodiments hereafter described are not intended to be exhaustive but rather to illustrate the principles of the invention to enable others skilled in the art to fully use the invention.

Referring now to the drawings, FIG. 1 depicts the insertion tool 10 adapted to place leads 6 of an integrated circuit 2 hereafter referred to as an IC, into printed circuit board holes 4. As is seen in FIGS. 3 and 4, tool 10 includes housing 12 which has sidewall 14 enclosed at one end by end wall 16 and at the other end by housing plug 18. Motor 20 is carried within housing 12 by connection to interior wall 22 of housing 12 with the rear portion of motor 20 being adjacent to end wall 16. Motor shaft 24 is journalled within interior wall 22. Drive shaft 26 is journalled within housing plug 18 of housing 12 so as to be axially shiftable between a retracted and extended position. Drive shaft 26 is connected to motor shaft 24 by helical spring 28 which serves the dual function of urging drive shaft 26 outwardly and transferring the rotation of motor shaft 24 to drive shaft 26. Motor 20 is shown in FIG. 4 as being suitably wired for connection to a DC power source.

Retainer member 30 formed of a conductive metal has base member 34 and parallel extending legs 32 connected so that base member 34 extends beyond legs 32 to form tabs 36. Legs 32 have an approximate 3° camber on the inner edges to facilitate easier chip insertion. FIGS. 4–9 illustrate outer race 38 of a bearing member press fitted within base part 34 of retainer member 30. Inner race 42 is press fitted onto connecting pin 44 which is fit within an end bore of drive shaft 26. The combintaion of pin 44 and the motor shaft bore is formed slightly off-center of drive shaft 26 so that upon rotation of drive shaft 26 retainer part 30 will have an orbital type motion. Base part 34 of retaining part 30 has guide pin holes 48, as shown in FIG. 3, to allow a shiftable and orbiting movement of retainer member 30 with respect to guide pins 50 which are press fitted into pedestal 52. Pedestal 52 is positioned between extending legs 32 of retainer member 30. Pedestal 52, as shown in the drawings, is fixed to housing plug 18 by virtue of guide pins 50 and adjustable to accommodate varying chip lead lengths by virtue of loosening and tightening set screws 54. Housing plug 18 of insertion tool 10 includes lips 78 which establish the outer limit of shiftable retainer member 30. Side walls 80 of plug 18 are spaced from tabs 36 of retainer 30 so that the orbital movement of the retainer is contained within a specific area.

As is shown in FIG. 4, drive shaft 26 is held in its extended position by latch pin 56 being seated within annular groove 58 of drive shaft 26. Latch pin 56 includes camming face 60 which is urged by helical spring 62 into contact with beveled face 64 of shuttle 66. The other end of shuttle 66 is conical and in contact with the camming face 68 of plunger 70 as is shown in FIG. 4. Plunger 70 is urged by helical spring 72 upward until pin 74, shown best in FIG. 3, of plunger 70, contacts the upper edge of groove 76 shown in FIG. 3. During operation, plunger 70 serves the dual purpose of releasing drive shaft 26 and of starting motor 20 when pin 74 depresses switch lever 82 of switch 84.

The positioning of plunger 70 in relation to the orientation of retaining member 30 is important. Insertion tool 10 will be held in the right hand in much the same fashion as the user holds a writing instrument. When one's index finger holds such an instrument, the finger is not at the top, nor at the side, but at an angle to the extension of the hand.

The angle approximates 30° from what could be considered a vertical orientation. If a person holds the tool in the most efficient and comfortable position for the insertion of an IC into a board, an imaginary line drawn through and parallel to legs 32 and up toward the user's fingers, this angle must be formed between that line and the line of plunger 70 into the tools. If this angle is not met, the tool will be awkward and difficult in use. This angle is best seen by referring to FIG. 2.

In operation, tool 10 is pressed down over IC 2 so that IC 2 is wedged by its leads between extending legs 32 of retainer 30 as is shown in FIG. 1. The user positions IC 2 and tool 10 over the accommodating printed circuit board holes and depresses plunger 70. FIGS. 7–9 illustrate that as plunger 70 is urged in the direction of arrow 86, camming face 68 of plunger 70 urges shuttle 66 in a direction shown in FIG. 7 by arrow 87. Beveled end 64 of shuttle 66 presses against camming face 60 of latch pin 56 to thereby urge latch pin 56 in the direction indicated by arrow 90 in FIG. 7. Latch pin 56 is subsequently urged out of annular groove 58 which allows shaft 26 to be axially shifted. Simultaneous with the release of shaft 26, pin 74 of plunger 70 urges switch lever 82 downward until the internal contacts of switch 84 contact to turn on motor 20 and rotate shaft 24. The rotation of shaft 24 is transferred to drive shaft 26 by spring 28. The offset placement of pin 44 into rotating drive shaft 26 gives retainer 30 an orbital motion which, when combined with the close proximity of tabs 36 to side walls 80, causes the retainer to vibrate rapidly. This orbital movement aids the user by rapidly vibrating IC leads 6 so as to cause flexure of the leads to make insertion easier. As IC leads 6 are positioned and lowered within holes 4, extending legs 32 of retainer 30 contacts the printed circuit board to thereby urge the retainer and drive shaft 26 inwardly as is illustrated by FIGS. 7–9. Since pedestal 52 is fixedly attached to housing plug 18, the inward movement of retainer member 30 presses IC 2 against the pedestal to release the IC.

Although, as explained previously, the principle of a robotized version of the invention remains unchanged, it will be appreciated that the implementation, absent the human factor, is somewhat different. In this second embodiment, the tool is shorter and mechanically more simple because certain of the operational functions are contained in the robotic device. In combination with a robot arm, a greater range of freedom and versatility of circuit installation can be achieved.

It will be recalled that, as mentioned heretofore, a multiplicity of insertion tools can be attached to any number of robot arms or devices.

Since the human aspect has been eliminated, this fact must be compensated for by somewhat equivalent functions. Rather than a finger activated plunger, represented by the numeral 70 in FIGS. 3 through 8, the robotized insertion tool is solenoid actuated. It was explained earlier that the angle and positioning of plunger 70 is critical to the most effective use of hand held tool 10. The position of plunger 70' on a robotized tool does not have this criticality and may be positioned at any location where it does not interfere with the opertion of the tool or with any of the robotic mechanisms.

Because many robotic systems are compressed air actuated, power for the rotating head may be provided by a small air turbine (not shown). In the alternative, there are available pancake-shaped electric motors which would fit into the space designated by the numberal 92 in FIGS. 10 and 11. The principal point being made is twofold, in that the insertion tool is readily adaptable to the robot system and in that certain functions are contained in the robot system rather than in individual tools.

Finally, the robotized insertion tool requires something to replace the human sense of touch when the IC leads 6 are positioned and lowered through the corresponding holes. Taken by itself, the robot is unable to sense resistance to the insertion, such as when a lead is misaligned. In such a situation, the robot would merely force the chip downwardly and wreak damage on whatever is in its path. There is in existence and readily available on the commercial market, a force sensitive resistor. This force sensitive resistor comprises a polymer sheet having an organic film printed thereon, which becomes more conductive as the force on its increases. This material is fixed to pedestal 52' and provides force-sensing feedback to prevent the use of excessive insertion force and permit the detection of IC's with damaged or misaligned leads or pins.

This second embodiment of the invention is depicted in FIGS. 10 and 11 as being adapted for connection to end 88 of a robotic arm (not shown). The numbering scheme of FIGS. 1-9 used is primed on FIGS. 10 and 11 to indicate the extent to which components with common numbers function in essentially the same manner.

The second embodiment utilizes a solenoid 94 to actuate pin 62, which is journalled within housing plug 18, for releasing shaft 26'. The specific method of activating solenoid 94 is straightforward, not itself a part of the invention and is accordingly not shown.

A pneumatic motor 98 is used to rotate motor shaft 24', thereby along with drive shaft 26' and open retainer member 30' creats the oscillatory motion previously described. Adapter plate 100 encloses motor 98 and is connected to arm end 88 via mounting screws 102. Alternatively, the pneumatic system within a given robot system may be utilized or a conventional pancake-shaped electric motor may be used and fit within the space in adapter plate 100.

In use, the second embodiment functions in essentially the same manner as the handheld embodiment described previously. The robotic arm or a multiplicity of arms (not shown) positions one or a multiplicity of retainers 30' over an IC component, as was shown in FIG. 1, to wedge the component between legs 32'. The arm then positions the component over the mating holes and lowers the component into position. As the component is being inserted, motor 98 rotates shaft 24' and subsequently drive shaft 26' and retainer 30' to cause orbital movement of the component. Solenoid 94 is then activated to cause pin 96 to retract from groove 58' of shaft 26' to allow insertion of the component as discussed previously.

Although this invention is herein described when used to insert integrated circuits into a printed circuit board, it will be understoood that its use is not so limited. The tool may, with only minor modification and without departing from the basic principles, be used to insert any electrical component having lead wires which are received by a component having mating holes. Indeed, it can lend intelligence to a host of assembly machines requiring multiple insertion of protruding leads or pins into receiving holes.

It is to be understood that the invention is not limited to the details above described but may be modified within the scope of the appended claims.

I claim:

1. A component insertion tool comprising a housing, retainer means carried by said housing for holding a component having legs during insertion of the component legs through accommodated holes in a board member, means for oscillating said retainer means relative to said housing to cause vibratory movement of said component and corresponding legs, release means for releasing said component from said holder after insertion of said components legs into said holes, a guide means within said housing for accommodating a shaft shiftable between an inward and an outward position, said shaft carrying said retainer means, and a lock mechanism engageable with said shaft to secure said shaft in said outward position.

2. The insertion tool of claim 1 including a means for activating said oscillating means simultaneously with the disengagement of said lock mechanism to permit said shaft to shift into its incurred position.

3. The insertion tool of claim 2 wherein said means for activating said oscillating means includes a switch having its actuating lever in shiftable contact with said lock mechanism, said oscillating means being an electric motor.

4. A component insertion tool comprising a housing, retainer means carried by said housing for holding a component during insertion of the component's legs through accommodating holes in a printed circuit board, means for oscillating said retainer means relative to said housing to cause movement of said component and corresponding legs, release means for releasing said component from said holder after insertion of said legs into said holes, said release means includes a platform carried by said housing and means for accommodating shiftable movement of said retaining means toward said housing to release said component from said retainer means upon contacting said platform, said retainer means including parallel bars spaced so as to frictionally hold said component between said bars by slightly compressing said component legs as said retainer is pressed onto said component, a guide means within said housing for accommodating a shaft shiftable between an inward and an outward position, said shaft carrying said retainer means, and a lock mechanism engageable with said shaft to secure said shaft in its outward position.

5. The insertion tool of claim 4 including a means for activating said oscillating means simultaneously with the disengagement of said lock mechanism to permit said shaft to shift into its inward position.

6. The insertion tool of claim 4 wherein said means for activating said oscillating means includes a switch having its actuating lever in shiftable contact with said lock mechanism.

* * * * *